US010312253B2

(12) United States Patent
Chiang et al.

(10) Patent No.: US 10,312,253 B2
(45) Date of Patent: Jun. 4, 2019

(54) THREE-DIMENSIONAL MEMORY DEVICE AND METHOD OF FORMING THE SAME

(71) Applicant: MACRONIX International Co., Ltd., Hsinchu (TW)

(72) Inventors: Chun-Ling Chiang, Hsinchu (TW); Chun-Min Cheng, Hsinchu (TW); Jung-Yi Guo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 186 days.

(21) Appl. No.: 15/458,421

(22) Filed: Mar. 14, 2017

(65) Prior Publication Data

US 2018/0269215 A1    Sep. 20, 2018

(51) Int. Cl.
*H01L 27/1157*    (2017.01)
*H01L 27/11582*    (2017.01)

(52) U.S. Cl.
CPC .... *H01L 27/1157* (2013.01); *H01L 27/11582* (2013.01)

(58) Field of Classification Search
CPC ........... H01L 27/1157; H01L 27/11524; H01L 27/21; H01L 27/8221; H01L 23/5226; H01L 23/27; H01L 23/0688; H01L 23/11551; H01L 27/11578; H01L 21/02164; H01L 21/0217; H01L 21/31111; H01L 29/0649
See application file for complete search history.

(56) References Cited

U.S. PATENT DOCUMENTS

| 8,884,357 | B2* | 11/2014 | Wang ................... H01L 27/115 257/324 |
| 9,230,982 | B1 | 1/2016 | Yuan et al. |
| 9,245,642 | B1 | 1/2016 | Chen et al. |
| 9,281,314 | B1 | 3/2016 | Kashimura et al. |
| 2011/0147824 | A1* | 6/2011 | Son ................... G11C 16/0483 257/324 |
| 2013/0130495 | A1 | 5/2013 | Higashitani et al. |
| 2014/0273373 | A1* | 9/2014 | Makala ............. H01L 27/11582 438/270 |
| 2014/0284697 | A1 | 9/2014 | Wang et al. |

(Continued)

FOREIGN PATENT DOCUMENTS

| TW | 201214631 | 4/2012 |
| TW | 201709294 | 3/2017 |

OTHER PUBLICATIONS

"Office Action of Taiwan Counterpart Application," dated Aug. 9, 2017, p. 1-p. 5.

*Primary Examiner* — Kyoung Lee
(74) *Attorney, Agent, or Firm* — J.C. Patents

(57) ABSTRACT

A method of forming a three-dimensional memory device is provided. Insulating layers and sacrificial layers are stacked alternatively on a substrate. At least one first opening is formed through the insulating layers and the sacrificial layers. Protection layers are formed on surfaces of the sacrificial layers exposed by the sidewall of the first opening. A charge storage layer is formed on the sidewall of the first opening and covers the protection layers. A channel layer is formed on the charge storage layer. The sacrificial layers and the protection layers are replaced with electrode layers. A three-dimensional memory device is further provided.

17 Claims, 8 Drawing Sheets

(56) References Cited

U.S. PATENT DOCUMENTS

2015/0348984 A1    12/2015   Yada et al.
2016/0218059 A1*   7/2016   Nakada ............. H01L 27/11582
2017/0264525 A1*   9/2017   Falk ........................ H04L 43/16

* cited by examiner

THREE-DIMENSIONAL MEMORY DEVICE AND METHOD OF FORMING THE SAME

BACKGROUND OF THE INVENTION

Field of Invention

The present invention is related to a semiconductor device and a method of forming the same, and more generally to a three-dimensional memory device and a method of forming the same.

Description of Related Art

Since non-volatile memory (e.g., flash memory) has the advantage that stored data does not disappear at power-off, it becomes a widely used memory device for a personal computer or other electronics equipment.

Currently, flash memory arrays commonly used in the industry include NOR flash memory and NAND flash memory. Since NAND flash memory has a structure in which memory cells are connected together in series, degree of integration and area utilization thereof are better than those of NOR flash memory. Thus, the NAND flash memory has been widely used in a variety of electronic products. Besides, to further enhance the degree of integration of the memory device, three-dimensional NAND flash memory is developed. However, there are still some challenges associated with NAND flash memory.

SUMMARY OF THE INVENTION

The present invention provides a method of forming a three-dimensional memory device, in which a charge storage layer is free of the damage of an etching solution containing phosphoric acid during the removal of silicon nitride sacrificial layers, and thus, the three-dimensional memory device is formed with improved performance.

The present invention provides a method of forming a three-dimensional memory device that includes the following steps. A plurality of insulating layers and a plurality of sacrificial layers are alternatively stacked on a substrate. At least one first opening is formed through the insulating layers and the sacrificial layers. A plurality of protection layers is formed on surfaces of the sacrificial layers exposed by a sidewall of the first opening. A charge storage layer is formed on the sidewall of the first opening and covers the protection layers. A channel layer is formed on the charge storage layer. The sacrificial layers and the protection layers are replaced with a plurality of electrode layers.

According to an embodiment of the present invention, the protection layers are silicon layers.

According to an embodiment of the present invention, the step of forming the protection layers includes performing a selective chemical vapour deposition process.

According to an embodiment of the present invention, in the selective chemical vapour deposition process, a reaction temperature ranges from about 300° C. to 520° C., and a reaction gas includes silane.

According to an embodiment of the present invention, a maximum thickness of each of the protection layers ranges from about 10 angstroms to 200 angstroms.

According to an embodiment of the present invention, each of the protection layers has a curved surface.

According to an embodiment of the present invention, the method further includes the following steps after forming the channel layer. An isolation layer is formed in a lower portion of the first opening. A conductive plug is formed in an upper portion of the first opening and in contact with the channel layer.

According to an embodiment of the present invention, the step of replacing the sacrificial layers and the protection layers with the electrode layers includes the following steps. At least one second opening is formed through the insulating layers and the sacrificial layers. The sacrificial layers and the protection layers exposed by the second opening are removed, so as to form a plurality of horizontal openings that expose a portion of the charge storage layer. The electrode layers are filled in the horizontal openings.

According to an embodiment of the present invention, the sacrificial layers are silicon nitride layers, and the protection layers are silicon layers.

According to an embodiment of the present invention, the step of removing the sacrificial layers and the protection layers includes removing the sacrificial layers with an etching solution containing phosphoric acid, and removing the protection layers with an etching solution containing ammonium hydroxide.

According to an embodiment of the present invention, each of the electrode layers includes a metal barrier layer and a metal layer.

According to an embodiment of the present invention, each of the electrode layers further includes a metal insulating layer formed between the metal barrier layer and the charge storage layer.

The present invention provides a three-dimensional memory device including a stacked structure, a charge storage layer and a channel layer. The stacked structure is disposed on a substrate and has at least one opening through the stacked structure. The stacked structure includes a plurality of insulating layers and a plurality of electrode layers alternatively stacked, and the electrode layers exposed by the opening are protruded with respect to the insulating layers exposed by the opening. The charge storage layer is disposed on a sidewall of the opening. The channel layer is disposed on the charge storage layer.

According to an embodiment of the present invention, ends of the electrode layers are protruded, by about 10 angstroms to 200 angstroms, with respect to ends of the insulating layers exposed by the opening.

According to an embodiment of the present invention, each of the ends of the electrode layers has a curved surface.

According to an embodiment of the present invention, each of the ends of the insulating layers has a substantially planar surface.

According to an embodiment of the present invention, each of the charge storage layer and the channel layer has a wave-like profile.

According to an embodiment of the present invention, the charge storage layer includes an oxide-nitride-oxide (ONO) composite layer.

According to an embodiment of the present invention, each of the electrode layers includes a metal barrier layer and a metal layer.

According to an embodiment of the present invention, each of the electrode layers further includes a metal insulating layer located between the metal barrier layer and the charge storage layer.

In view of the above, in the method of the invention, a silicon protection layer is formed between a charge storage layer and each of sacrificial layers. Such silicon protection layers can protect the charge storage layer from being damaged by the etching solution containing phosphoric acid during the removal of the silicon nitride sacrificial layers.

Accordingly, the three-dimensional memory device is formed with improved performance.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
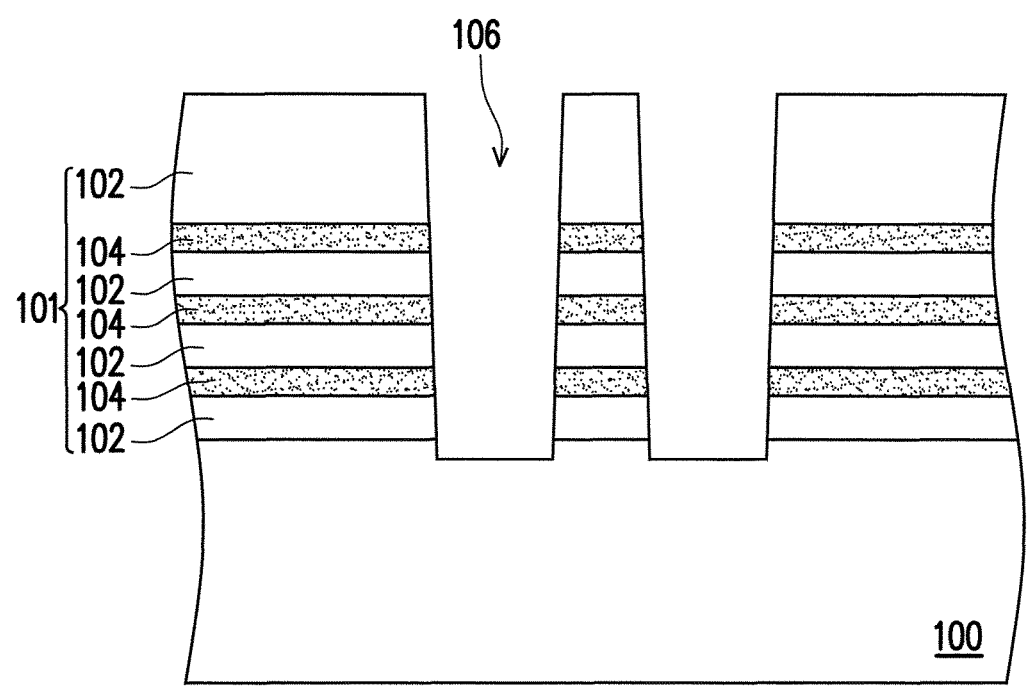
FIG. 1A to FIG. 1H are schematic cross-sectional views of a method of forming a three-dimensional memory device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like elements.

FIG. 1A to FIG. 1H are schematic cross-sectional views of a method of forming a three-dimensional memory device according to an embodiment of the present invention.

Referring to FIG. 1A, a stacked structure 101 is formed on a substrate 100. The substrate 100 can be a semiconductor substrate, such as a silicon-containing substrate. In an embodiment, upon the design requirements, the substrate 100 has a doped region formed therein. Besides, the stacked structure 101 includes a plurality of insulating layers 102 and a plurality of sacrificial layers 104 alternatively stacked. In an embodiment, the insulating layers 102 include silicon oxide, the sacrificial layers 104 include silicon nitride, and the forming method thereof includes performing multiple chemical vapour deposition (CVD) processes.

Thereafter, a patterning process is performed to partially remove the stacked structure 101, and therefore form one or more openings 106 through the insulating layers 102 and the sacrificial layers 104. In an embodiment, a portion of the substrate 100 is simultaneously removed during the patterning process, so the openings 106 extend into the substrate 100. In an embodiment, each of the openings 106 can have a substantially vertical or slightly inclined sidewall, as shown in FIG. 1A.

Figure 1B:
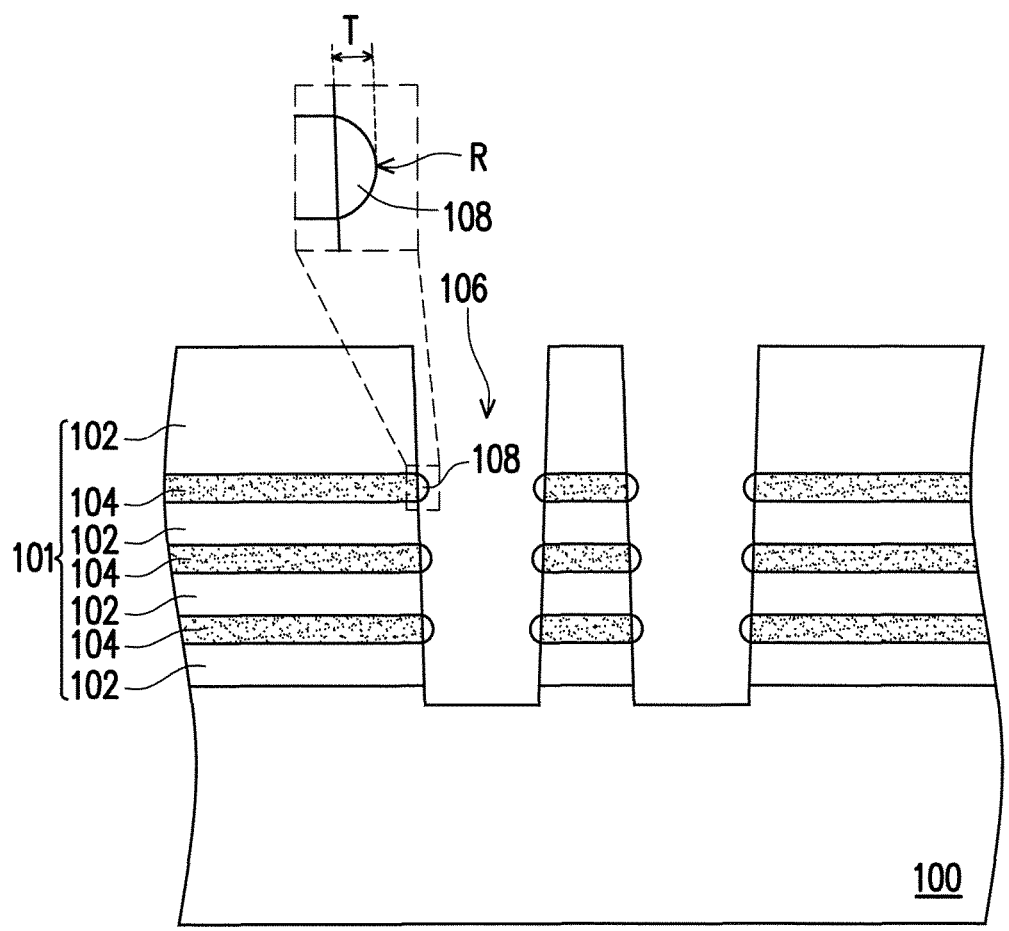

Referring to FIG. 1B, a plurality of protection layers 108 are formed on surfaces of the sacrificial layers 104 exposed by the sidewall of each of the openings 106. In an embodiment, the step of forming the protection layers 108 includes performing a selective chemical vapour deposition (selective CVD) process. In an embodiment, when the protection layers 108 are silicon layers, the reaction temperature in the selective chemical vapour deposition process ranges from about 300° C. to 520° C., and the reaction gas includes silane. The reaction temperature can be, for example but not limited to, about 300° C., 325° C., 350° C., 375° C., 400° C., 425° C., 450° C., 475° C., 500° C., 520° C., including any range between any two of the preceding values. The reaction gas includes $SiH_4$, $Si_2H_6$, $Si_3H_3$ or a combination thereof. When the reaction temperature and the reaction gas are appropriately selected, the protection layers 108 (e.g., silicon layers) are selectively formed merely on the sacrificial layers 104 (e.g., silicon nitride layers), rather than the insulating layers 102 (e.g., silicon oxide layers). In an embodiment, the protection layers 108 are initially formed as amorphous silicon layers, and transformed into polycrystalline silicon layers during the subsequent step such as the step of forming the charge storage layer 112. In another embodiment, the protection layers 108 are initially formed as polycrystalline silicon layers.

In an embodiment, each of the protection layers 108 has a curved surface. Specifically, each of the protection layers 108 has an uneven thickness varying from 1 angstrom to 200 angstroms. In an embodiment, the maximum thickness T of each of the protection layers 108 ranges from about 10 angstroms to 200 angstroms. The maximum thickness T can be, for example but not limited to, about 10 angstroms, 20 angstroms, 30 angstroms, 40 angstroms, 50 angstroms, 60 angstroms, 70 angstroms, 80 angstroms, 90 angstroms, 100 angstroms, 150 angstroms, 200 angstroms, including any range between any two of the preceding values. In an embodiment, due to the disposition of the protection layers 108, the sidewall of the opening 106 of FIG. 1B is formed with a plurality of separate recesses R, and the protection layers 108 are respectively embedded in the recesses R.

Figure 1C:
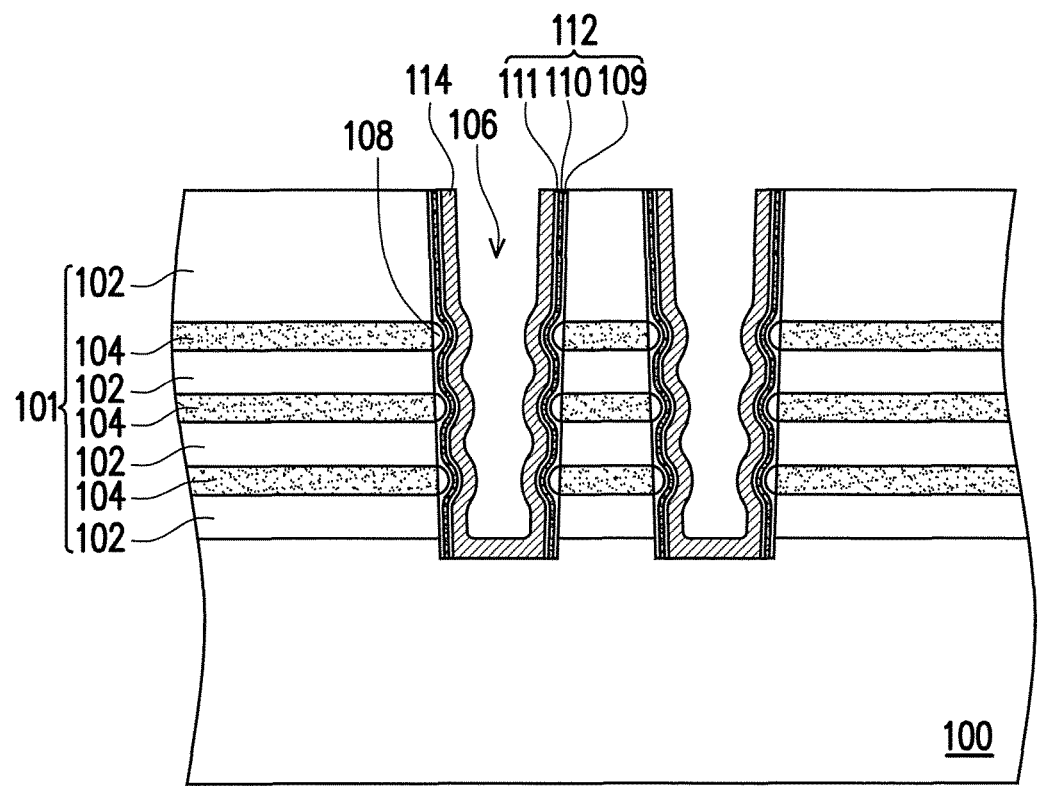

Referring to FIG. 1C, a charge storage layer 112 is formed on the sidewall of each of the openings 106, and covers the protection layers 108 and the insulating layers 102. In an embodiment, each of the charge storage layers 112 is an oxide-nitride-oxide (ONO) composite layer, which includes a silicon oxide layer 109, a silicon nitride layer 110 and a silicon oxide layer 111. In an embodiment, the method of forming the charge storage layers 112 includes performing multiple chemical vapour deposition processes to form an ONO composite material layer, and then performing an anisotropic etching process to remove a portion of the ONO composite material layer. Specifically, each of the charge storage layers 112 is formed as a spacer on the sidewall of the corresponding opening 106, and exposes the bottom of the same opening 106.

Thereafter, a channel layer 114 is formed on each of the charge storage layers 112. In an embodiment, the channel layers 114 include polycrystalline silicon, and the forming method thereof includes performing a chemical vapour deposition process to form a channel material layer on surfaces of the stacked structure 101 and the openings 106, and then removing the channel material layer outside of the openings 106. Specifically, each of the channel layers 114 covers the charge storage layer 112 on the sidewall of the corresponding opening 106, and in contact with the substrate 100 exposed by the bottom of the same opening 106.

Figure 1D:
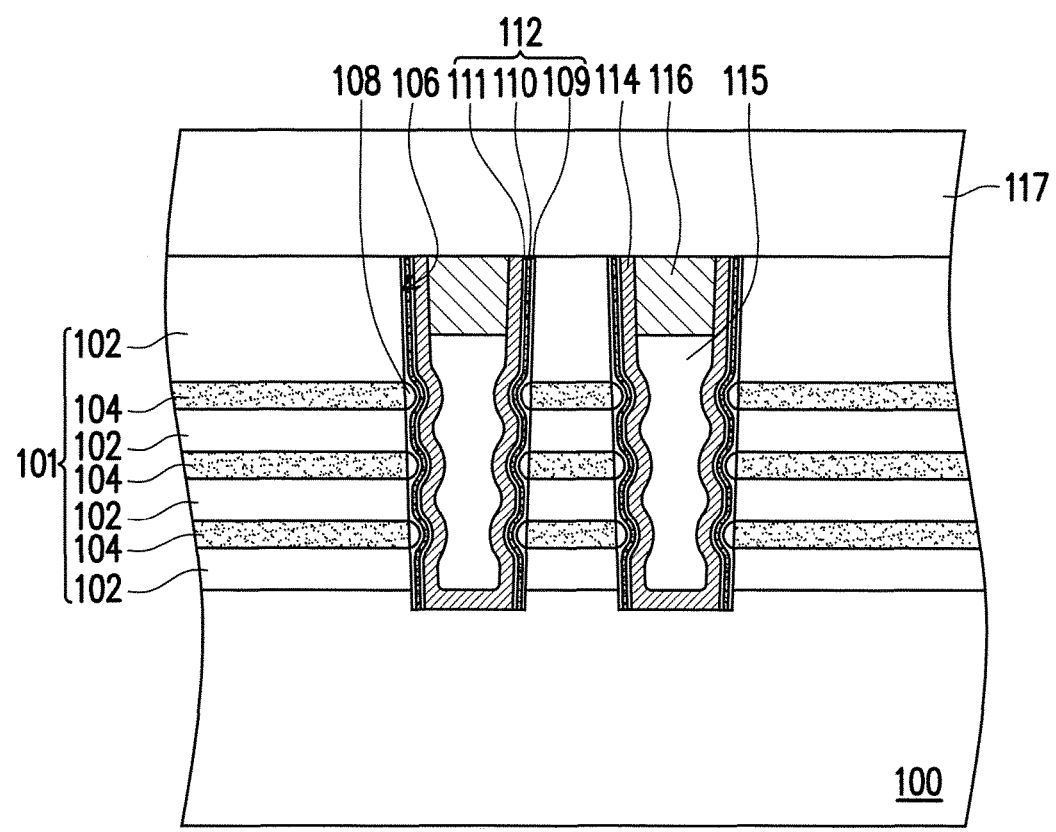

Referring to FIG. 1D, isolation layers 115 are formed in lower portions of the openings 106. In an embodiment, the isolation layers 115 include silicon oxide or spin-on-dielectric (SOD), and the forming method thereof includes performing a chemical vapour deposition process or a spin coating to form an isolation material layer that fills up the openings 106, and then performing an etching back process to the isolation material layer.

Thereafter, conductive plugs 116 are formed in upper portions of the openings 106 and in contact with the channel layers 114. In an embodiment, the conductive plugs 116 include polycrystalline silicon, and the forming method thereof includes performing a chemical vapour deposition process to form a conductive material layer that fills up the openings 106, and then removing the conductive material layer outside of the openings 106.

Afterwards, an insulating layer 117 is formed on the stacked structure 101. The insulating layer 117 covers the conductive plugs 116 and the stacked structure 101. In an embodiment, the insulating layer 117 includes silicon oxide, and the forming method thereof includes performing a chemical vapour deposition process.

Figure 1E:
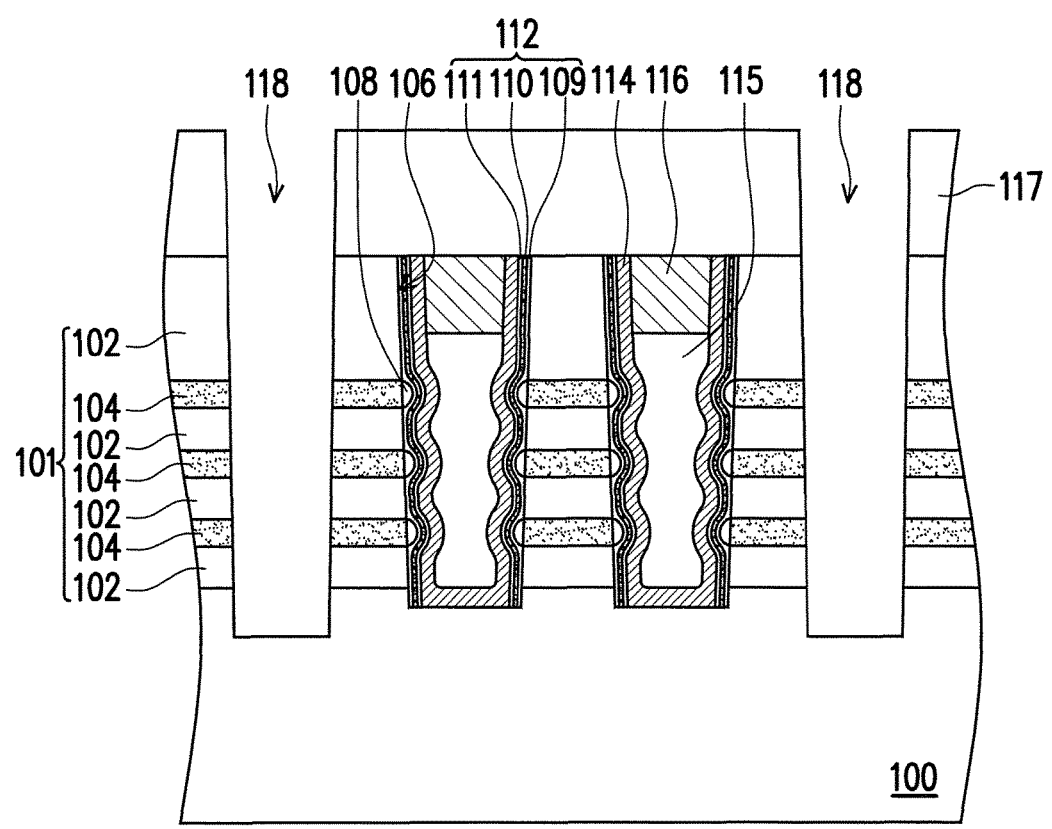
Figure 1F:
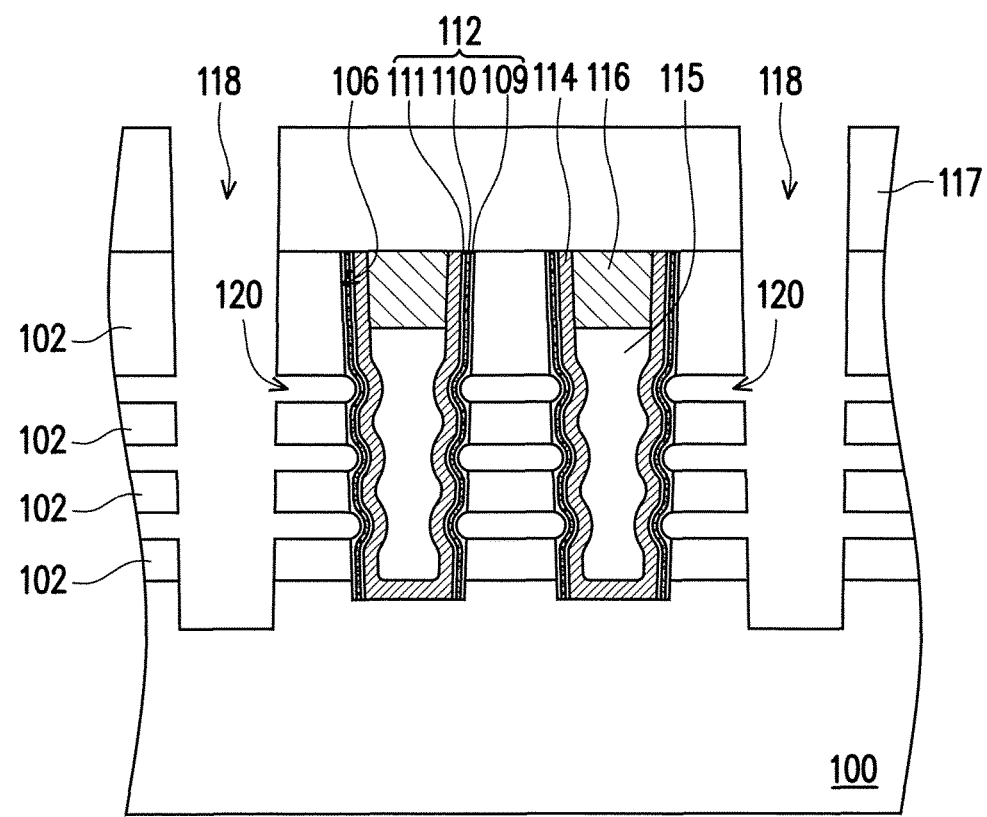
Figure 1G:
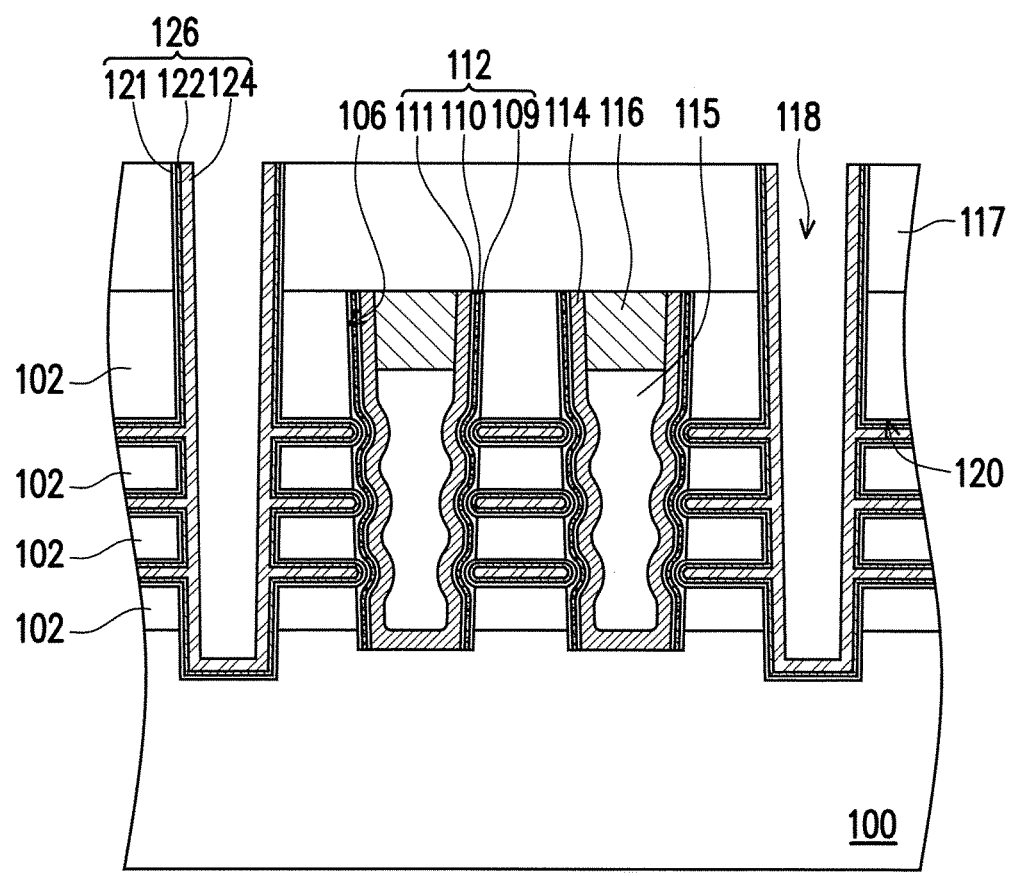

Referring to FIG. 1E to FIG. 1G, the sacrificial layers 104 and the protection layers 108 are replaced with a plurality of electrode layers 126. In an embodiment, as shown in FIG. 1E, a patterning process is perfoitued to partially remove the insulating layer 117 and the stacked structure 101, and therefore form one or more openings 118 through the insulating layer 117, the insulating layers 102 and the sacrificial layers 104. In an embodiment, a portion of the substrate 100 is simultaneously removed during the patterning process, so the openings 118 extend into the substrate 100. In an embodiment, each of the openings 118 can have a substantially vertical or slightly inclined sidewall, as shown in FIG. 1E. In an embodiment, bottoms of the openings 118 are lower than bottoms of the openings 106.

Thereafter, as shown in FIG. 1F, the sacrificial layers 104 and the protection layers 108 exposed by the openings 118 are removed, so as to form a plurality of horizontal openings 120 that expose portions of the charge storage layers 112. In an embodiment, the sacrificial layers 104 are removed with an etching solution containing phosphoric acid ($H_3PO_4$) by using the protection layers 108 as etching stop layers. In an embodiment, after the step of removing the sacrificial layers 104, the protection layers 108 are removed with an etching solution containing ammonium hydroxide ($NH_4OH$).

It is noted that, in the conventional method, since the etching solution containing phosphoric acid does not have a high etching selectivity ratio of silicon nitride to silicon oxide, the removal of silicon nitride sacrificial layers often damages the ONO charge storage layer adjacent to the silicon nitride sacrificial layers. Therefore, the storage efficiency is reduced and the device performance is deteriorated. However, in the present invention, a silicon protection layer is formed between a charge storage layer and each of silicon nitride sacrificial layers, so as to prevent the charge storage layer from being damaged by the etching solution containing phosphoric acid. Specifically, since the etching solution containing phosphoric acid has a high etching selectivity ratio of silicon nitride to silicon, the silicon protection layers 108 of the invention can protect the silicon oxide layer 109 and/or the silicon nitride layer 110 of the charge storage layer 112 from being damaged by the etching solution containing phosphoric acid during the removal of the silicon nitride sacrificial layers 104.

Thereafter, as shown in FIG. 1G, electrode layers 126 are filled in the horizontal openings 120. In an embodiment, each of the electrode layers 126 includes a metal barrier layer 122 and a metal layer 124. In an embodiment, the metal barrier layers 122 include titanium (Ti), titanium nitride (TiN), tantalum (Ta), tantalum nitride (TaN) or a combination thereof, and the forming method thereof includes performing a chemical vapour deposition process. In an embodiment, the metal layers 124 include tungsten (W), and the forming method thereof includes performing a chemical vapour deposition process. In an embodiment, each of the electrode layers 126 further includes a metal insulating layer 121 formed between the metal barrier layer 122 and the corresponding charge storage layer 112. In an embodiment, the metal insulating layers 121 include metal oxide having a dielectric constant greater than 8 or even greater than 10, such as aluminium oxide ($Al_2O_3$), and the forming method thereof includes performing a chemical vapour deposition process or an atomic layer deposition (ALD) process. In an embodiment, the metal insulating layers 121, the metal barrier layers 122 and the metal layers 124 are not only filled into the horizontal openings 120 but also formed on surfaces of the openings 118, as shown in FIG. 1G.

Figure 1H:
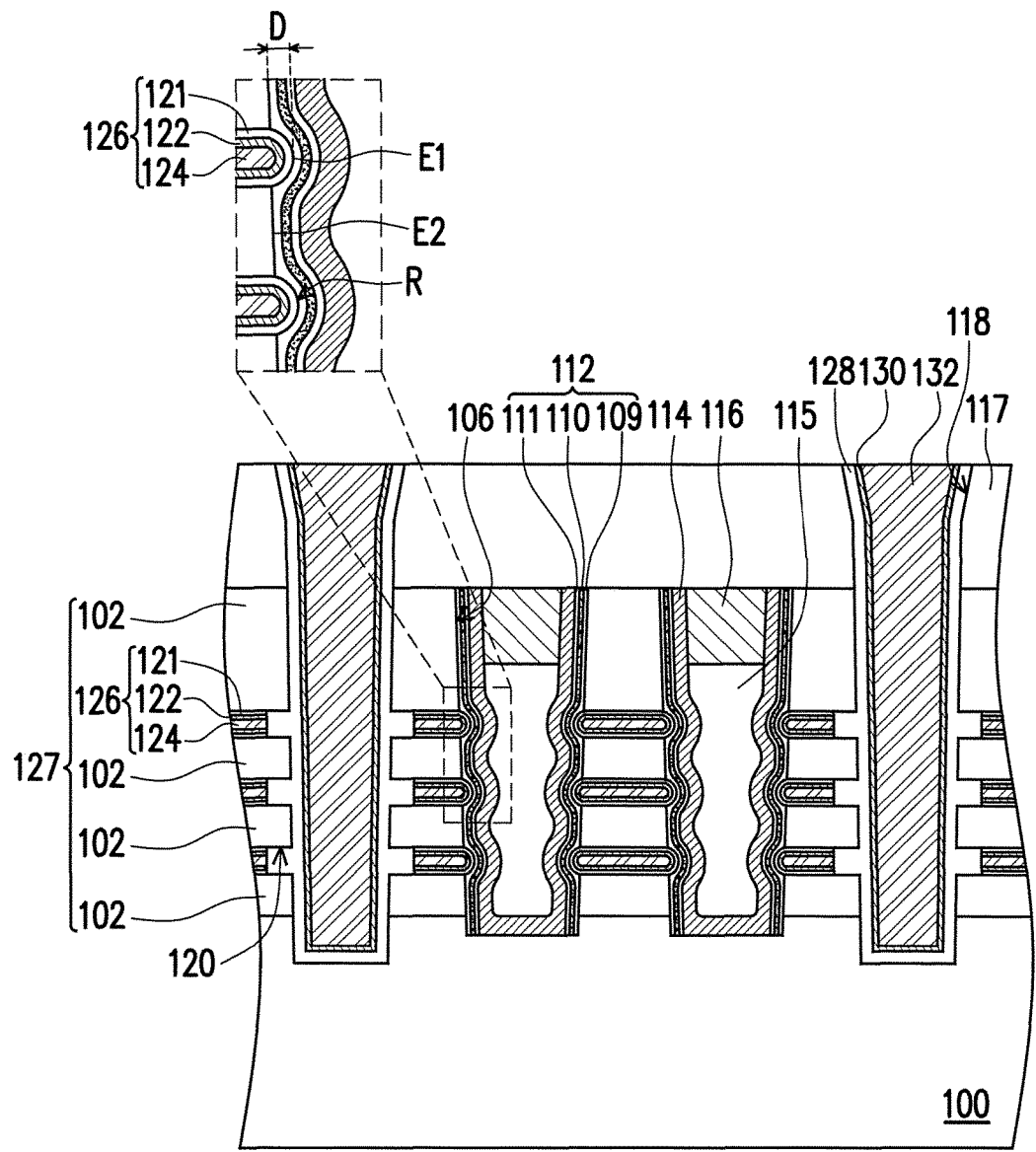

Referring to FIG. 1H, the metal insulating layers 121, the metal barrier layers 122 and the metal layers 124 formed on the surfaces of the openings 118 are removed. Thereafter, an insulating layer 128, a metal barrier layer 130 and a metal layer 132 are sequentially formed in each of the openings 118. In an embodiment, the insulating layers 128 include silicon oxide, the metal barrier layers 130 include titanium nitride, and the metal layers 132 include tungsten. In an embodiment, the metal insulating layers 121, the metal barrier layers 122 and the metal layers 124 filled in the horizontal openings 120 adjacent to the openings 118 are partially removed during the removing step, and the resulting spaces are filled with the subsequently formed insulating layers 128. The three-dimensional memory device of the invention is thus completed.

The structure of the three-dimensional memory device of the invention is illustrated below with reference to FIG. 1H. The three-dimensional memory device of the invention includes a stacked structure 127, a charge storage layer 112 and a channel layer 114. The stacked structure 127 is disposed on a substrate 100 and has at least one opening 106 through the stacked structure 127. The stacked structure 127 includes a plurality of insulating layers 102 and a plurality of electrode layers 126 alternatively stacked, and the electrode layers 126 exposed by the opening 106 are protruded with respect to the insulating layers 102 exposed by the opening 106. In an embodiment, ends E1 of the electrode layers 126 are protruded, by about 10 angstroms to 200 angstroms, with respect to ends E2 of the insulating layers 102 exposed by the opening 106. Specifically, in an embodiment, each of the ends E1 of the electrode layers 126 has a curved surface, each of the ends E2 of the insulating layers 102 has a substantially planar surface, and the ends E1 of the electrode layers 126 are protruded, by a distance D of about 10 angstroms to 200 angstroms, with respect to the ends E2 of the insulating layers 102 exposed by the opening 106. The distance D can be, for example but not limited to, about 10 angstroms, 20 angstroms, 30 angstroms, 40 angstroms, 50 angstroms, 60 angstroms, 70 angstroms, 80 angstroms, 90 angstroms, 100 angstroms, 150 angstroms, 200 angstroms, including any range between any two of the preceding values.

From another point of view, the sidewall of the opening 106 has a plurality of separate recesses R, and the ends E1 of the electrode layers 126 are embedded into the recesses R. In an embodiment, each of the electrode layers 126 includes an optional metal insulating layer 121, a metal barrier layer 122 and a metal layer 124, and the metal insulating layers 121, the metal barrier layers 122 and the metal layers 124 are partially located in the recesses R of the sidewall of the opening 106.

The charge storage layer 112 is located on the sidewall of the opening 106. In an embodiment, the charge storage layer 112 includes an ONO composite layer. The channel layer 114 is disposed on the charge storage layer 112. In an embodiment, the channel layer 114 includes polycrystalline silicon. In an embodiment, since the electrode layers 126 are protruded from the insulating layers 102 in the stacked structure 127, each of the charge storage layer 112 and the channel layer 114 adjacent to the stacked structure 127 has a wave-like profile. In another embodiment, the side of the charge storage layer 112 adjacent to the stacked structure 127 has a wave-like profile, while the side of the charge storage layer 112 away from the the stacked structure 127 has a substantially planar profile. In an embodiment, the charge storage layer 112 is disposed on the sidewall of the opening 106 and exposes the bottom of the opening 106. The channel layer 114 is disposed on the sidewall and bottom of the opening 106 and in contact with the substrate 100.

In an embodiment, the three-dimensional memory device of the invention further dudes an isolation layer 115 and a conductive plug 116. The isolation layer 115 is located in the lower portion of the opening 106, and the channel layer 114 surrounds the isolation layer 115. The conductive plug 116 is located in the upper portion of the opening 106 and in contact with the channel layer 114.

In summary, in the method of the invention, a silicon protection layer is formed between an ONO charge storage layer and each of silicon nitride sacrificial layers, so as to prevent the charge storage layer from being damaged by the etching solution containing phosphoric acid. Specifically, since the etching solution containing phosphoric acid has a high etching selectivity ratio of silicon nitride to silicon, the silicon protection layers of the invention can protect the charge storage layer from being damaged by the etching solution containing phosphoric acid during the removal of the silicon nitride sacrificial layers. Accordingly, the three-dimensional memory device is formed with improved performance.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a three-dimensional memory device, comprising:
   forming a plurality of insulating layers and a plurality of sacrificial layers alternatively stacked on a substrate;
   forming at least one first opening through the insulating layers and the sacrificial layers;
   forming a plurality of protection layers on surfaces of the sacrificial layers exposed by a sidewall of the first opening;
   forming a charge storage layer on the sidewall of the first opening, the charge storage layer covering the protection layers;
   forming a channel layer on the charge storage layer; and
   replacing the sacrificial layers and the protection layers with a plurality of electrode layers,
   wherein each of the protection layers has a curved surface.

2. The method of claim 1, wherein the protection layers are silicon layers.

3. The method of claim 1, wherein the step of forming the protection layers comprises performing a selective chemical vapour deposition process.

4. The method of claim 3, wherein in the selective chemical vapour deposition process, a reaction temperature ranges from 300° C. to 520° C., and a reaction gas comprises silane.

5. The method of claim 1, wherein a maximum thickness of each of the protection layers ranges from 10 angstroms to 200 angstroms.

6. The method of claim 1, further comprising, after the step of forming the channel layer,
   forming an isolation layer in a lower portion of the first opening; and
   forming a conductive plug in an upper portion of the first opening, the conductive plug being in contact with the channel layer.

7. The method of claim 1, wherein the step of replacing the sacrificial layers and the protection layers with the electrode layers comprises:
   forming at least one second opening through the insulating layers and the sacrificial layers;
   removing the sacrificial layers and the protection layers exposed by the second opening, so as to form a plurality of horizontal openings exposing a portion of the charge storage layer; and
   filling the electrode layers in the horizontal openings.

8. The method of claim 7, wherein the sacrificial layers are silicon nitride layers, and the protection layers are silicon layers.

9. The method of claim 8, wherein the step of removing the sacrificial layers and the protection layers comprises:
   removing the sacrificial layers with an etching solution containing phosphoric acid; and
   removing the protection layers with an etching solution containing ammonium hydroxide.

10. The method of claim 1, wherein each of the electrode layers comprises a metal barrier layer and a metal layer.

11. The method of claim 10, wherein each of the electrode layers further comprises a metal insulating layer formed between the metal barrier layer and the charge storage layer.

12. A three-dimensional memory device, comprising:
    a stacked structure, disposed on a substrate and having at least one opening through the stacked structure, wherein the stacked structure comprises a plurality of insulating layers and a plurality of electrode layers alternatively stacked, and the electrode layers exposed by the opening are protruded with respect to the insulating layers exposed by the opening;
    a charge storage layer, disposed on a sidewall of the opening; and
    a channel layer, disposed on the charge storage layer,
    wherein each of the ends of the electrode layers has a curved surface, and
    wherein each of the electrode layers comprises a metal barrier layer and a metal layer.

13. The three-dimensional memory device of claim 12, wherein ends of the electrode layers are protruded, by 10 angstroms to 200 angstroms, with respect to ends of the insulating layers exposed by the opening.

14. The three-dimensional memory device of claim 13, wherein each of the ends of the insulating layers has a substantially planar surface.

15. The three-dimensional memory device of claim 12, wherein each of the charge storage layer and the channel layer has a wave-like profile.

16. The three-dimensional memory device of claim 12, wherein the charge storage layer comprises an oxide-nitride-oxide (ONO) composite layer.

17. The three-dimensional memory device of claim 12, wherein each of the electrode layers further comprises a metal insulating layer located between the metal barrier layer and the charge storage layer.

* * * * *